US009437472B2

(12) United States Patent
Fang et al.

(10) Patent No.: US 9,437,472 B2
(45) Date of Patent: Sep. 6, 2016

(54) SEMICONDUCTOR LINE FEATURE AND MANUFACTURING METHOD THEREOF

(71) Applicant: TAIWAN SEMICONDUCTOR MANUFACTURING COMPANY LTD., Hsinchu (TW)

(72) Inventors: Wen-Han Fang, New Taipei (TW); Po-Chi Wu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 32 days.

(21) Appl. No.: 14/192,439

(22) Filed: Feb. 27, 2014

(65) Prior Publication Data

US 2015/0243547 A1 Aug. 27, 2015

(51) Int. Cl.
*H01L 21/762* (2006.01)
*H01L 29/78* (2006.01)

(52) U.S. Cl.
CPC ......... *H01L 21/76232* (2013.01); *H01L 29/78* (2013.01)

(58) Field of Classification Search
CPC ............. H01L 21/302; H01L 21/3065; H01L 21/308; H01L 21/3083; H01L 21/3086
See application file for complete search history.

(56) References Cited

U.S. PATENT DOCUMENTS

| | | | | |
|---|---|---|---|---|
| 6,074,930 | A * | 6/2000 | Cho et al. | 438/424 |
| 6,277,752 | B1 * | 8/2001 | Chen | 438/692 |
| 6,794,302 | B1 * | 9/2004 | Chang et al. | 438/714 |
| 6,921,724 | B2 * | 7/2005 | Kamp et al. | 438/715 |
| 7,135,396 | B1 * | 11/2006 | Gabriel et al. | 438/612 |
| 2007/0221622 | A1 * | 9/2007 | Kim | 216/68 |
| 2010/0207208 | A1 * | 8/2010 | Bedell et al. | 257/346 |
| 2011/0155694 | A1 * | 6/2011 | Jang et al. | 216/68 |

OTHER PUBLICATIONS

Office action issued by Taiwan Intellectual Property Office on Jan. 20, 2016.

* cited by examiner

*Primary Examiner* — Duy T Nguyen
*Assistant Examiner* — Bo Bin Jang
(74) *Attorney, Agent, or Firm* — Chun-Ming Shih

(57) ABSTRACT

Some embodiments of the present disclosure provide a semiconductor structure with a reduced line feature. The semiconductor structure includes a substrate, a first active region in the substrate and having a first sidewall, a second active region in the substrate and having a second sidewall, an isolation region contacting the first sidewall and the second sidewall. The above-mentioned semiconductor structure possesses a width of a top surface of the isolation region less than 50 nm and a width of a bottom surface of the isolation region more than 20 nm. Some embodiments provide a method for controlling a semiconductor line feature in a wafer, including patterning a hard mask exposing a line feature with a line width narrower than 50 nm on a wafer, forming a trench on the wafer correlated to the line feature by performing a plasma dry etch over the wafer, and filling the trench with isolation materials.

18 Claims, 11 Drawing Sheets

112B
112A
112A
112B
70
610'
620'
611'
621'
602
605
603
601
D1'
102
104
100
A
B
B 90
621'
605
603
601
105c
611'
104
100
D1'
105b
D2'
620'
102
120
105s
105s
610'

SEMICONDUCTOR LINE FEATURE AND MANUFACTURING METHOD THEREOF

BACKGROUND

Shallow trench isolation (STI) is widely adopted in an integrated circuit (IC) to provide electrical isolation between adjacent semiconductor devices formed in a substrate. In a CMOS integrated circuit, STIs are typically formed between like kinds of NMOS or PMOS transistors in a given well or substrate to suppress leakage current between neighboring devices. These are generally referred to as intra-well isolations. STIs may also be formed between NMOS and PMOS transistors formed in separate wells. STIs thus formed are generally referred to as inter-well isolations and are typically used to suppress leakage current between neighboring devices of opposite-type and/or to prevent CMOS latchup from happening, which typically causes device failure.

STIs in a semiconductor device isolate a P-well and an N-well formed in a twin-well CMOS manufacturing process. NMOS and PMOS transistors are then formed in the P-well and N-well, respectively, having source/drain regions and gate regions. Inter-well STIs are formed to separate n+ region of NMOS transistor and p+ region of PMOS transistor. Intra-well STIs are also created to separate n+ region and an adjacent n+ region in the P-well, p+ region and an adjacent p+ region in the N-well, respectively.

STIs may start with forming an STI trench by an etching operation, overfilling the STI trenches with a dielectric such as an oxide, and then removing the dielectric outside the STI trenches. This dielectric helps to electrically isolate the active areas from each other. Typically, forming STI trenches involves creating shallow trenches into semiconductor substrate through an anisotropic etch operation, filling the STI trench with a dielectric material, such as CVD silicon oxide ($SiO_2$), and removing the excess dielectric using a planarization process, such as chemical mechanic polishing (CMP). In general, the inter-well STI isolation spacing (i.e., n+-to-p+) is substantially wider than the minimum intra-well STI isolation spacing (i.e., n+-to-n+ or p+-to-p+) in order to provide desired isolation effects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
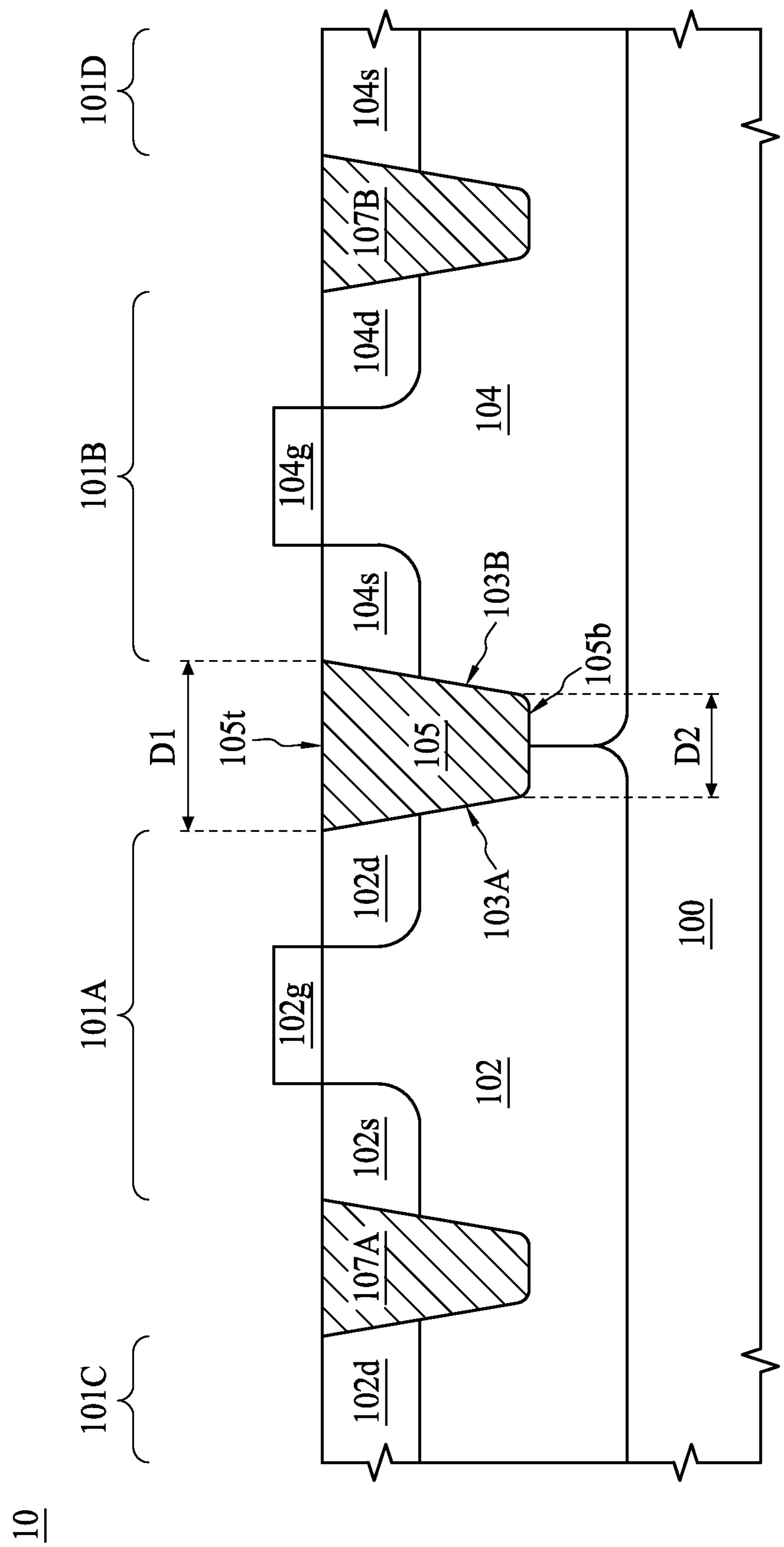
FIG. 1 shows a cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, an "active region" performs the actual computing and storage operations of the semiconductor device. The active region in which amplifying, rectifying, or other dynamic action occurs in a semiconductor device. For example, the active region in the present disclosure refers to the transistor region where a gate, a source and a drain, and a semiconductor well are situated. The active region referred herein is not limited to a specific doping type but encompassing both the N-type transistor region and the P-type transistor region. The active region referred herein is not limited to a specific device geometry (e.g. planar transistor) but including both the planar MOSFET and the non-planar FinFET structure.

As the trend of integrating more and more circuit functions in a single IC continues, the structure of existing STIs is gradually becoming one of the major bottlenecks for the further device feature size scaling in advanced technology. Furthermore, a simple feature size shrinkage on an existing STI can lead to deteriorated isolation characteristics and poor device performance. For example, when the critical dimension of a CMOS structure scales down to below 40 nm, STIs prepared by conventional practice show a bridged bottom due to the fact that a tapered sidewall of the STI trench hinders the entrance of the etching gas and thus creates a spatial barrier for an effective etching. The bottom portion of the STI trench in a reduced dimension structure can be narrower than that in a wider dimension structure. Typically the bottom portion can be bridged by a deposition layer formed on sidewalls of the STI trench during an anisotropic dry etch. The formation of the deposition layer on the STI trench sidewalls can be referred to later description of the present disclosure.

One drawback or challenge related to the structure of a conventional STI in advanced processing technology is that a shrunken inter-well STI typically reduces the n+-to-N-well and p+-to-P-well spacing. This shrunken spacing is particularly severe in the bottom portion of the STI trench. When this spacing gets too small, the threshold voltage to turn on the channel regions of the parasitic field device along the side walls of an STI will become very low. Hence, leakage current may substantially increase along the P-well-to-STI, and N-well-to-STI interfaces.

Additional detrimental effects include lateral punch through in the parasitic device and latchup in the CMOS circuits. Although conventional remedies, such as an increased well dopant concentration and a precisely controlled well doping profile, may be employed to alleviate these problems, these remedies involve increased processing complexity and are generally very difficult to conduct in advanced technology.

Some embodiments of the present disclosure provide a reduced dimension STI structure which possesses an isolation region having a top surface width less than 50 nm and a bottom surface width more than 20 nm. In some embodiments, the reduced dimension STI structure provides two sidewalls of active regions adjacent to the isolation region to be more than 88 degrees.

Some embodiments of the present disclosure provide a method for manufacturing the reduced dimension STI structure described herein, and a method for controlling the line width feature of the reduced dimension STI structure on a wafer. In some embodiments, the manufacturing method provided herein includes temperature zone control of an electrostatic chuck (ESC) during etching operations and/or STI rounding operation. In some embodiments, the manufacturing method provided herein includes plasma density control across different zones during plasma etching operations.

FIG. 1 shows a cross sectional view of a semiconductor structure 10 in accordance with some embodiments of the present disclosure. The semiconductor structure 10 includes a substrate 100, a first active region 101A and a second active region 101B adjacent to the first active region 101A, both positioned in the substrate 100. The first active region 101A refers to a particular area where the semiconductor device performs the actual computing and storage operations. For example, as shown in FIG. 1, the first active region 101A includes a P-well 102, an N-doped source region 102*s* and an N-doped drain region 102*d*, and an NMOS gate 102*g*. Similarly, the second active region 101B includes an N-well 104, a P-doped source region 104*s* and a P-doped drain region 104*d*, and a PMOS gate 104*g*. In FIG. 1, the P-well 102 of the first active region 101A and the N-well 104 of the second active region 101B are partially connected in proximity to a bottom portion of the two wells. However, an isolation region 105 is separating the P-well 102 of the first active region 101A and the N-well 104 of the second active region 101B, as well as the N-doped drain region 102*d* and the P-doped source region 104*s*. A first sidewall 103A of the first active region 101A and a second sidewall 103B of the second active region 101B are contacting the isolation region 105.

The isolation region 105 has a top surface 105*t* with a first width D1 measured from a first boundary between the isolation region 105 and the first active region 101A to a second boundary between the isolation region 105 and the second active region 101B. In some embodiments, the first width D1 of the top surface 105*t* is less than 50 nm. Moreover, the isolation region 105 has a bottom surface 105*b* with a second width D2 measured from a first boundary between the isolation region 105 and the first active region 101A to a second boundary between the isolation region 105 and the second active region 101B. In some embodiments, the second width D2 of the bottom surface 105*b* is more than 20 nm. In some embodiments, the isolation region is a shallow trench isolation (STI).

Still referring to FIG. 1, the first active region and the second active region described in the present disclosure are not limited to the active region with opposite doping type. In some embodiments, the third active region 101D and the second active region 101B possess same doping type. Isolation region 107B separating the third active region 101D and the second active region 101B of the same doping type can be referred to as an intra-well isolation, whereas the isolation region 107A separating the first active region 101A and the second active region 101B of different doping types can be referred to as an inter-well isolation. It shall be understood that the isolation structure described in the present disclosure encompasses both the inter-well isolation and the intra-well isolation. In some embodiments, the dimension of the intra-well isolation is smaller than the dimension of the inter-well isolation. However, all the isolation structures provided herein possess the first width D1 of the top surface 105*t* less than 50 nm and the second width D2 of the bottom surface 105*b* more than 20 nm.

Figure 2:
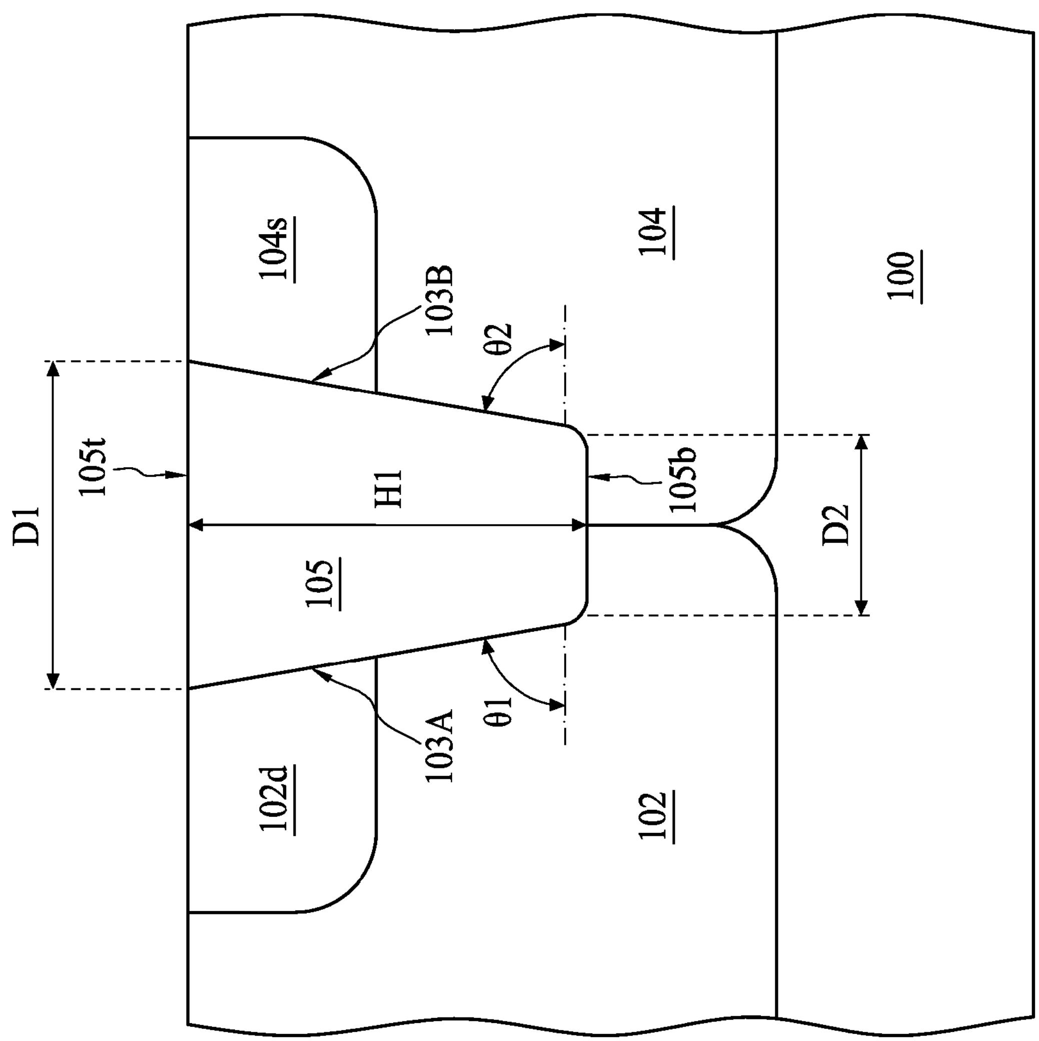
FIG. 2 shows an enlarged cross sectional view of a semiconductor isolation structure in accordance with some embodiments of the present disclosure.

FIG. 2 is an enlarged cross sectional view of the semiconductor isolation region 105 in FIG. 1 in accordance with some embodiments of the present disclosure. An aspect ratio of the isolation region 105 can be defined as a ratio of a height H1 of the isolation region 105 and an average of the first width D1 and the second width D2 (i.e., H1/(D1/2+D2/2)). In some embodiments, the aspect ratio of the isolation region 105 is within a range of from about 4 to about 10. In FIG. 2, the first sidewall 103A possesses a sidewall angle θ1 gripped between the first sidewall 103A and a horizontal line extending into the first active region 102. In some embodiments, the sidewall angle θ1 is greater than 88 degrees. In FIG. 2, the second sidewall 103B possesses a sidewall angle θ2 gripped between the second sidewall 103B and a horizontal line extending into the second active region 104. In some embodiments, the sidewall angle θ2 can be greater or smaller than 88 degrees. The first sidewall angle θ1 can be equal to or different from the second sidewall angle θ2.

Figure 3:
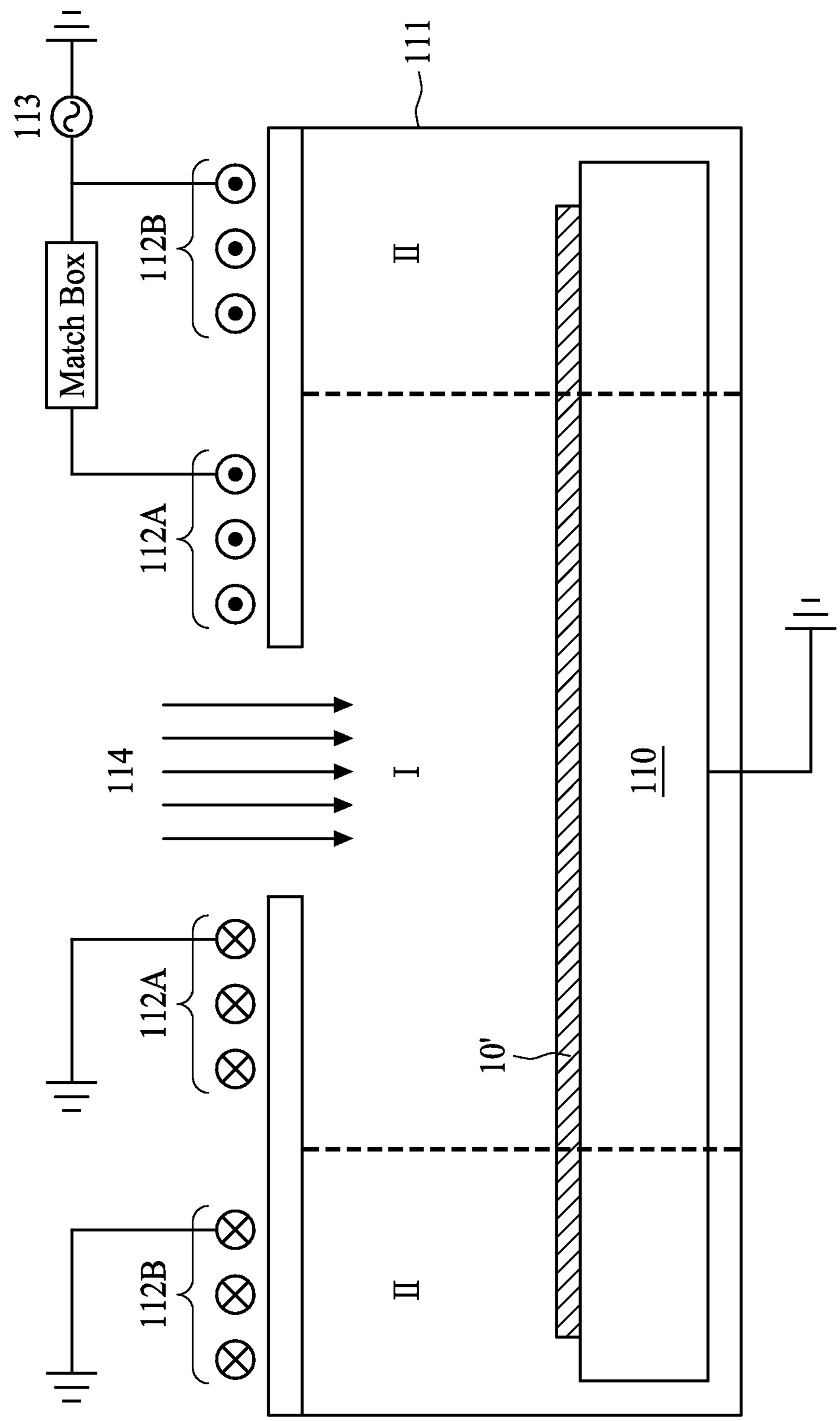
FIG. 3 shows a cross sectional view of a plasma reactor used in some manufacturing methods provided in accordance with some embodiments of the present disclosure.

FIG. 3 shows a cross sectional view of a plasma reactor used in some manufacturing methods provided in accordance with some embodiments of the present disclosure. A plasma reactor 30 for providing a high density plasma, on the order of about $10^{12}$ ions per $cm^2$, for etching a substrate, includes a plasma reactor chamber 111 that is fitted with a gas inlet 114 for receiving a processing gas into the chamber 111. In addition to the gas inlet 114, the chamber 111 is further provided with an outlet conduit (not shown) for connecting the chamber to an evacuation source, such as vacuum pump (not shown). The evacuation source should be sufficient to enable a very low operating pressure in the chamber in the range of about 1 to 50 mTorr, which is usually sufficient for maintenance of a high density plasma on the order of about $10^{12}$ ions per $cm^2$.

In FIG. 3, an ESC 110 supporting a wafer 10' including the semiconductor structure 10 as in FIG. 1 is positioned close to a bottom portion of the chamber 111. Two sets of electromagnetic coils are positioned above the chamber 111. The first set of electromagnetic coils 112A is situated close to a top middle portion of the chamber 111, and the second set of electromagnetic coils 112B is situated close to a top peripheral portion of the chamber 111. According to the arrangement of the two sets of the electromagnetic coils, plasma density inside the chamber 111 can be separately controlled in two different zones. For example, the plasma density in zone I of the chamber 111 can be dominated by the current passing through the first electromagnetic coil 112A, and zone I shown in FIG. 3 refers to a center portion of the chamber 111. On the other hand, the plasma density in zone II inside the chamber 111 can be dominated by the current passing through the second electromagnetic coil 112B, and zone II shown in FIG. 3 refers to a peripheral portion inside the chamber 111.

As shown in FIG. 3, the first electromagnetic coil 112A and the second electromagnetic coil 112B are connected to a radio frequency (RF) signal source 113 through an impedance matchbox. In some embodiments, the radio frequency signal source 113 is capable of providing a radio frequency signal at about 13.56 MHz. In some embodiments, the ESC 110 may be configured to control the temperature of the wafer 10' by providing passages (not shown) in the ESC for flowing a fluid, such as water, or a gas, such as helium. In some embodiments, the ESC 110 may be configured to control the temperature of the wafer 10' by providing a higher amount of current passing through the conductive paths inside or around the ESC.

Figure 4A:
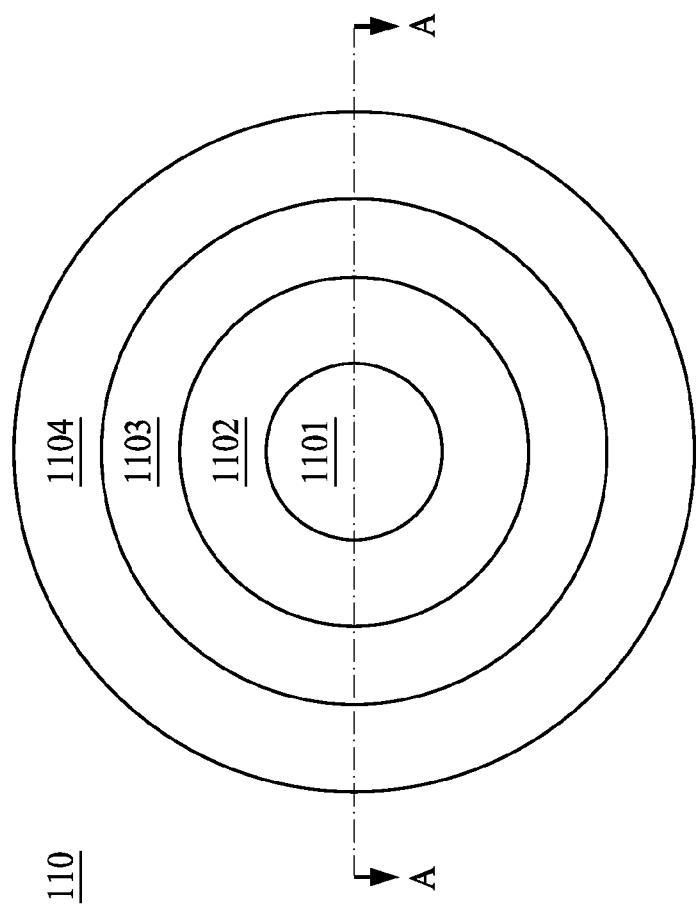
FIG. 4A shows a top view of an electrostatic chuck with various temperature controlling zones in accordance with some embodiments of the present disclosure.

FIG. 4A shows a top view of an ESC 110 with various temperature controlling zones supporting a wafer in accordance with some embodiments of the present disclosure. In some embodiments, two temperature zones, namely a higher temperature zone close to an edge of the wafer (1103, 1104), and a lower temperature zone close to a center of the wafer (1101, 1102) can be separately controlled by the means previously described in the present disclosure. In other embodiments, four temperature zones, namely the first zone 1101, the second zone 1102, the third zone 1103, and the fourth zone 1104, can be formed on the ESC 110. However, the number of zones is not limited by the embodiments provided herein, any number of zones can be created as long as the equipment allows. As can be seen in FIG. 4A, a concentric-distributed temperature zones are provided. However, the geometry of the temperature distribution zones are not limited to the concentric fashion, other suitable temperature zone distribution are also applicable and shall be enclosed within the scope of the present disclosure.

Figure 4B:
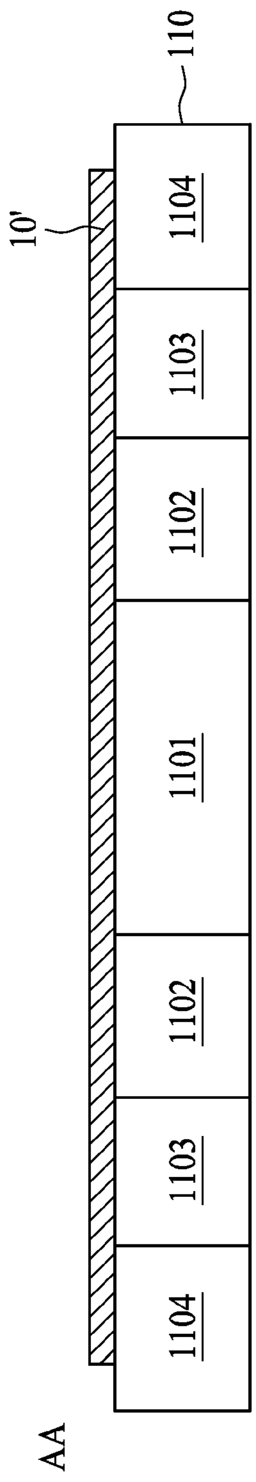
FIG. 4B shows a cross sectional view of an electrostatic chuck with various temperature zones supporting a wafer in accordance with some embodiments of the present disclosure.

FIG. 4B shows a cross sectional view along line AA of FIG. 4A showing the ESC 110 with various temperature zones in accordance with some embodiments of the present disclosure. In FIG. 4B, a wafer 10' is positioned on the ESC 110 with various temperature zones, and hence the wafer 10' can be subject to different temperature zones while the etching operation being performed thereon. For example, symmetric to the first temperature zone 1101 lies the second temperature zone 1102, the third temperature zone 1103, and the fourth temperature zone 1104. Accordingly, the wafer 10' positioned on the ESC 110 can at least be divided into more than one temperature zones. In some embodiments, two temperature zones can be obtained by controlling the first temperature zone 1101 and the second temperature zone 1102 at one temperature, whereas controlling the third temperature zone 1103 and the forth temperature zone 1104 at another temperature. In some embodiments, four temperature zones can be achieved by separately controlling the four zones at different temperatures.

Figure 5:
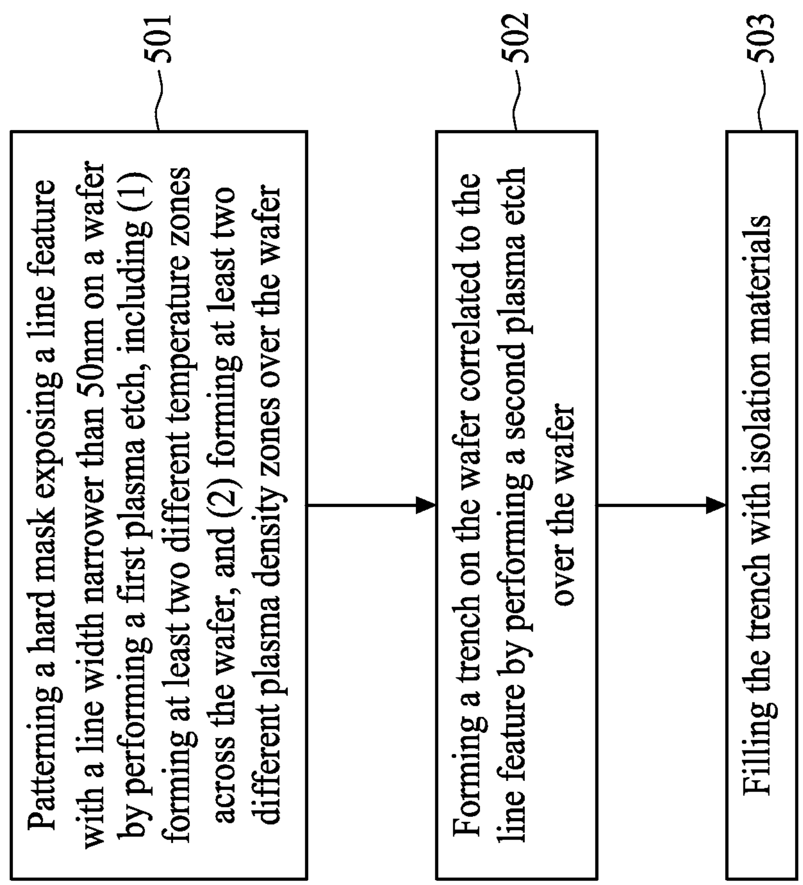
FIG. 5 shows operation steps in accordance with some embodiments of the present disclosure.

FIG. 5 shows operations of the semiconductor isolation structure in accordance with some embodiments of the present disclosure. The operations includes patterning a hard mask exposing a line feature with a line width narrower than 50 nm on a wafer by performing a first plasma etch S501; forming a trench on the wafer correlated to the line feature by performing a second plasma etch over the wafer S502; and filling the trench with isolation materials S503. The first plasma etch further includes (1) forming at least two different temperature zones across the wafer, and (2) forming at least two different plasma density zones over the wafer.

Figure 6:
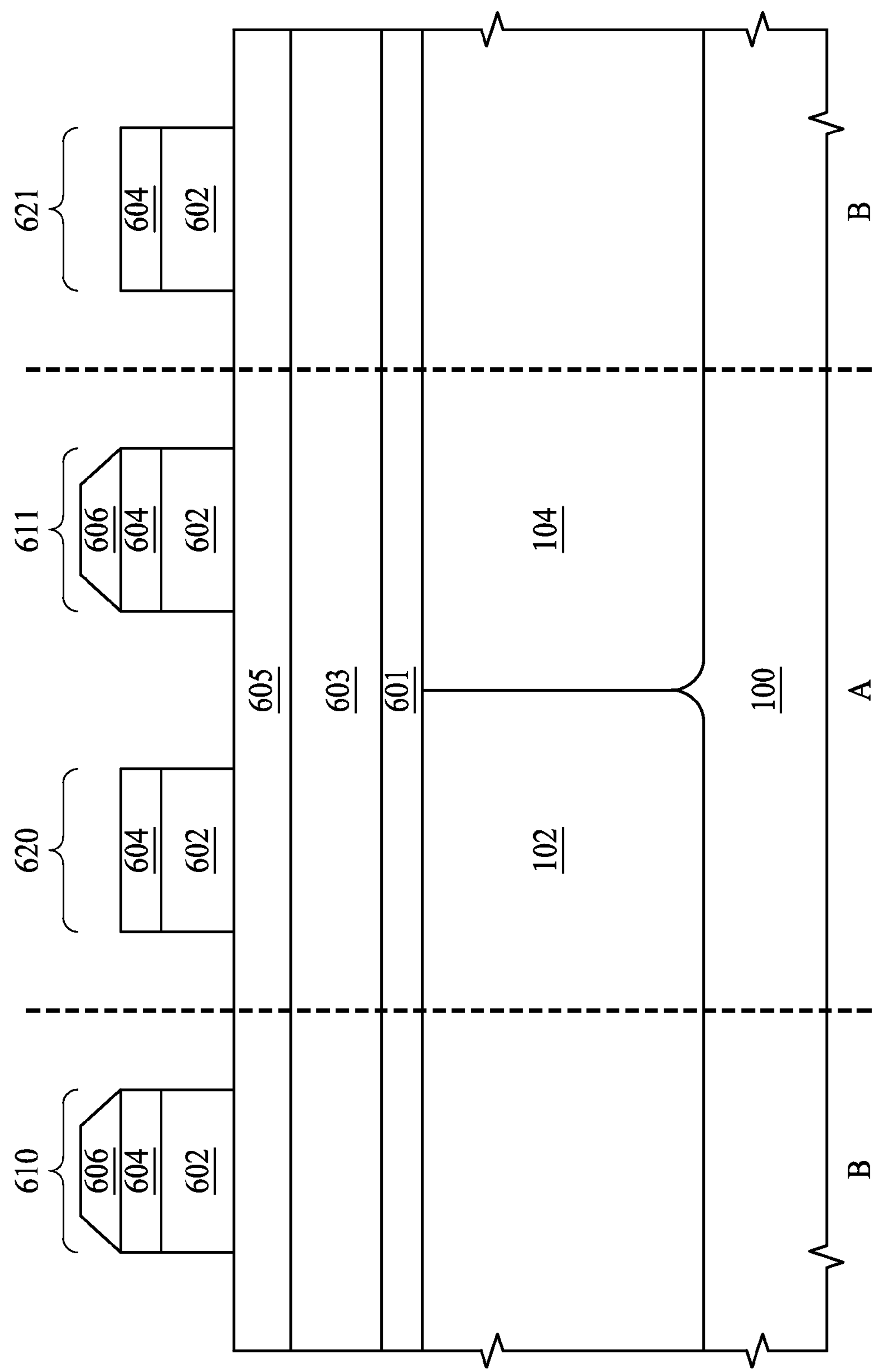
FIG. 6 to FIG. 11 show cross sectional views of a semiconductor structure in various operation stages in accordance with some embodiments of the present disclosure.
Figure 7:
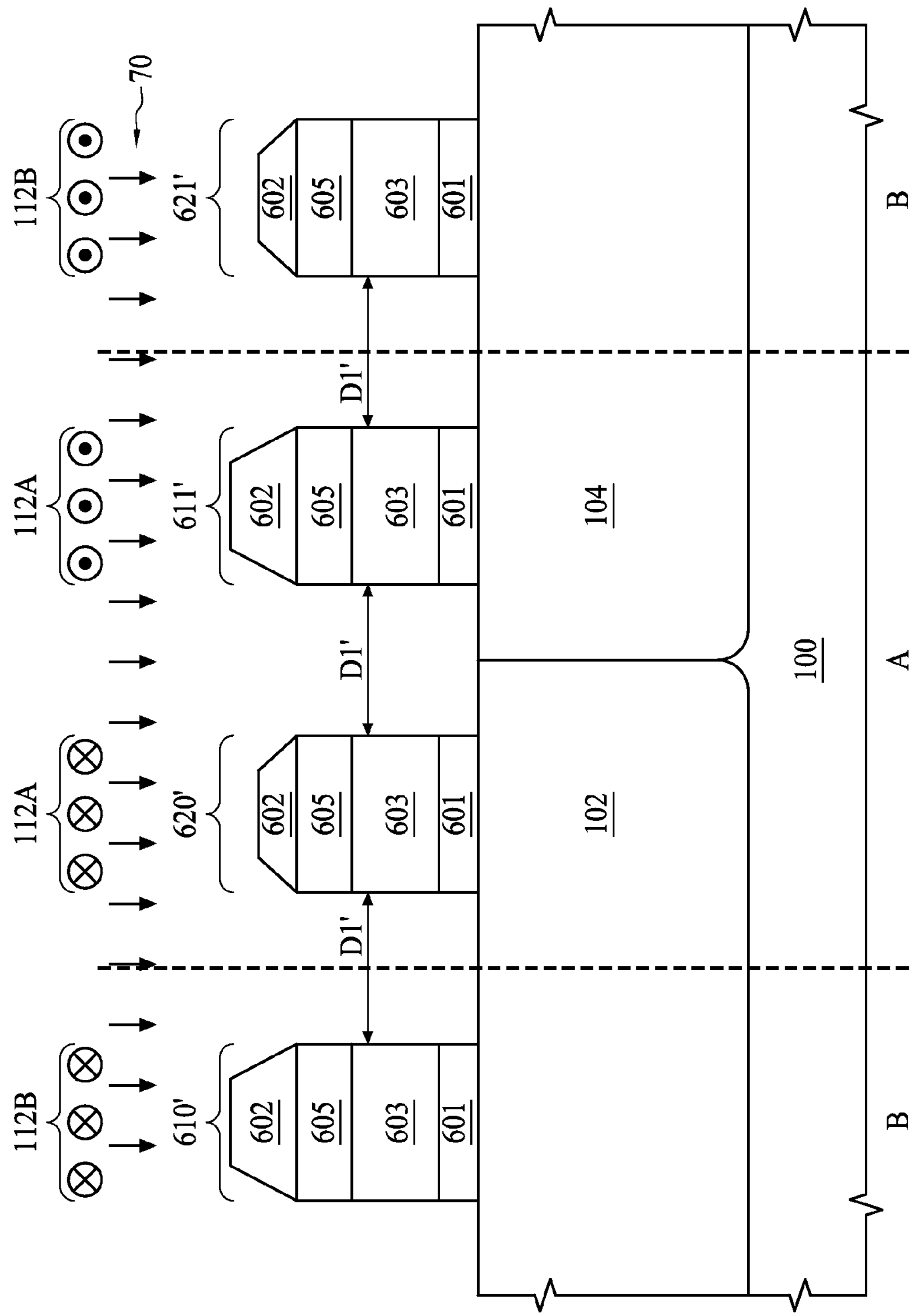
Figure 8:
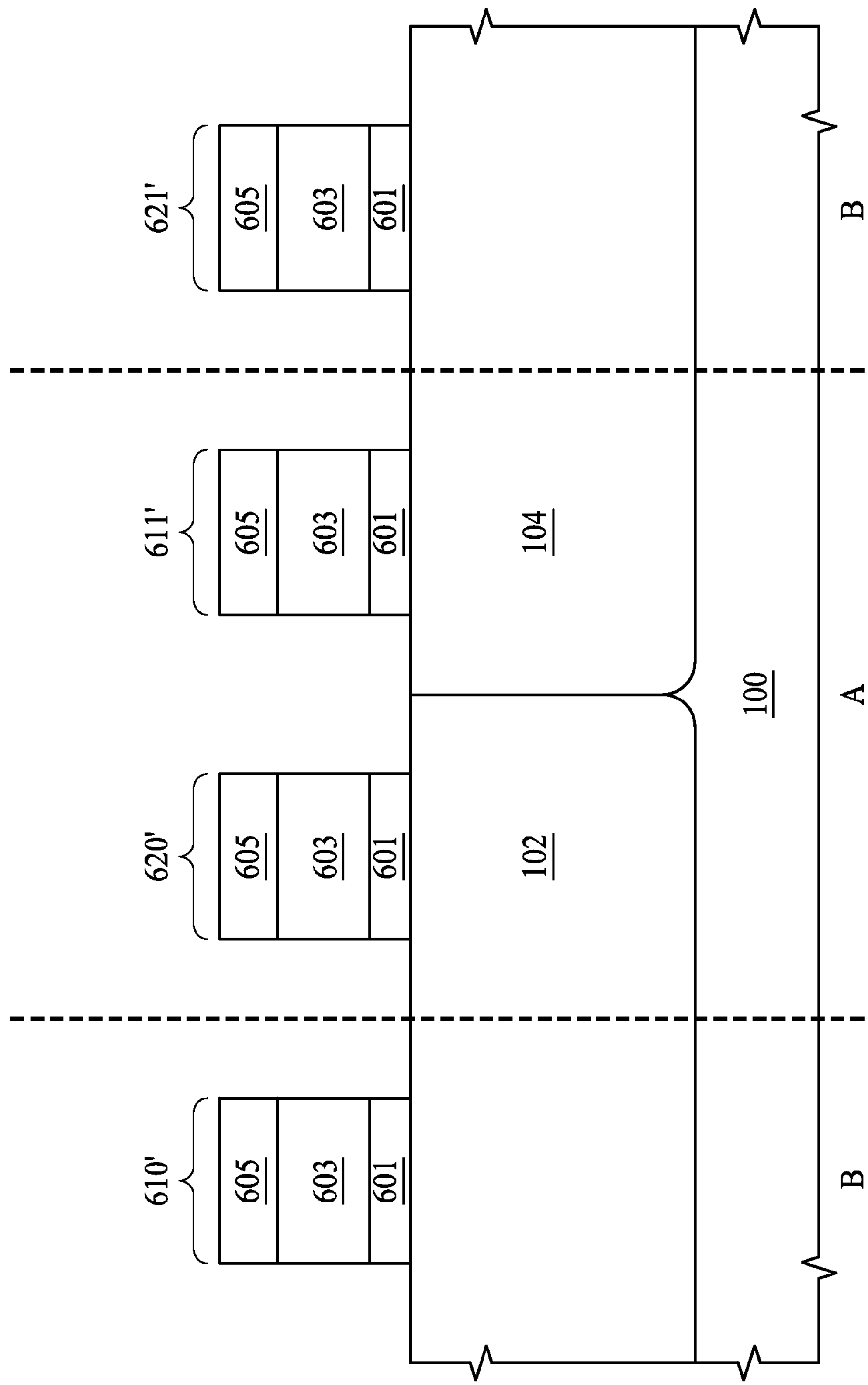

FIG. 6 to FIG. 11 show cross sectional views of a semiconductor structure in various operational stages in accordance with some embodiments of the present disclosure. Operation S501 is illustrated in FIGS. 6-8. In FIG. 6, a cross sectional view of a semiconductor structure under operation is shown. Numeral labels in FIG. 6 that are identical to those in FIG. 1 and FIG. 2 refer to the same elements or their equivalents, hence is not repeated here for simplicity. The semiconductor structure in FIG. 6 includes a first oxide layer 601, a first hard mask layer 603, and a second oxide layer 605. A mask pattern layer including pattern features 610, 620, 611, 621 are positioned on the second oxide layer 605.

Referring to FIG. 6, in some embodiments, the pattern features 610 and 611 are identical, and the pattern features 620 and 621 are identical in terms of the multi-layer structure each possesses. For example, pattern features 610 and 611 have an ash-removable dielectric layer (ARD) 602, a third oxide layer 604, and a second hard mask layer 606, whereas pattern features 620 and 621 have an ash-removable dielectric layer 602 and a third oxide layer 60, but without the second hard mask layer 606. The difference between the pattern features 610 and 611 and the pattern features 620 and 621 can be, for example, due to different manufacturing histories such that the pattern features 610 and 611 are defined in a different operation from the definition of the pattern features 620 and 621. In some embodiments, defining the interlaced pattern features 610, 620, 611, 621 in different operations is to achieve a smaller line width between adjacent pattern features.

Still referring to FIG. 6, the semiconductor structure is subject to two different zones A and B. In some embodiments, zones A and B are in contact with different temperature zones of an ESC. In some embodiments, zones A and B are situated in different plasma density zones. In the present disclosure, the different temperature zones can be roughly correlated to different plasma density zones. However, in some embodiments, the temperature zones may not be physically correlated to the plasma density zones. However, zone A shown in FIG. 6 refers to a portion of the semiconductor structure close to a center of the wafer, whereas zone B refers to a portion of the semiconductor structure close to an edge of the wafer.

In FIG. 7, the first hard mask layer 603 is patterned by a first plasma etch to obtain a line feature D1' which is narrower than 50 nm. In some embodiments, the first hard mask features 610', 620', 611', 621' are formed by an anisotropic plasma etch in a plasma etch chamber. The chamber pressure can be controlled within a range of from about 1 to about 10 mTorr with fluorine-containing etching gas 70 such as a mixture of $CH_2F_2$, $CF_4$, $O_2$, $N_2$ and Ar. During the plasma etch operation, the substrate is DC biased between about 100 volts and about 500 volts, while an RF discharge having a power between about 500 Watts and about 1000 Watts is released into the etch chamber. In alternative embodiments, an anisotropic reactive ion etch (RIE) may be used to remove the exposed portions of hard mask layer 603, the first oxide layer 601, and the second oxide layer 605. Other suitable dry etch processes are not excluded from the scope of the present disclosure. In some embodiments, about 5% to about 10% over etch time is conducted in order to assure complete removal of hard mask layer 603 in the exposed areas.

In some embodiments, the etching of the first hard mask features 610' and 621' are subject to a first temperature imposed by specific temperature zones of the ESC in FIG. 4B. In the same operation, the etching of the first hard mask features 620' and 611' are subject to a temperature different from the first temperature imposed by another specific temperature zones of the ESC in FIG. 4B. In some embodiments, the first temperature imposed on the first hard mask features 610' and 621' forms a higher temperature zone close to an edge of the wafer, and another temperature zone imposed on the first hard mask features 620' and 611' forms a lower temperature zone close to a center of the wafer. In some embodiments, the higher temperature zone is maintained within a range of from about 40 to about 60 degrees Celsius. In some embodiments, the lower temperature zone is maintained three degrees lower than the corresponding higher temperature zone. As previously described, different temperature maintained at the higher temperature zone and the lower temperature zone can be controlled by flowing a fluid, such as water, or a gas, such as helium, to cool down the ESC, by passing desired amount of current into or around the ESC, or by the combination thereof.

Still referring to FIG. 7, during the patterning of the hard mask layer 603, the current passing through the electromagnetic coils 112A and 112B may be different. In some embodiments, the current passing through the electromagnetic coil 112B is greater than the current passing through the electromagnetic coil 112A. Consequently, the plasma density formed in zone B (i.e., the region close to an edge of the wafer) can be either greater than or substantially equal to the plasma density formed in zone A (i.e., the region close to a center of the wafer). In some embodiments, a current ratio between the current entering the electromagnetic coil 112A and 112B is in a range of from about 0.5 to about 0.8. As shown in FIG. 7, the first hard mask features 610' and 621' are subject to a first plasma density zone established by the current passing through the electromagnetic coil 112B, whereas the first hard mask features 620' and 611' are subject to a second plasma density zone established by the current passing through the electromagnetic coil 112A. As can be seen in FIG. 7, the thickness of the ARD 602 varies between the first hard mask features 610', 611' and the first hard mask features 620', 621' due to the different masking patterns as illustrated in FIG. 6.

In FIG. 8, the ARD 602 is removed by an ash operation, and hence exposing the second oxide layer 605 underneath. Starting from this operation, the first hard mask features 610', 620', 611', and 621' are substantially identical masking patterns with a same multilayer structure.

Figure 9:
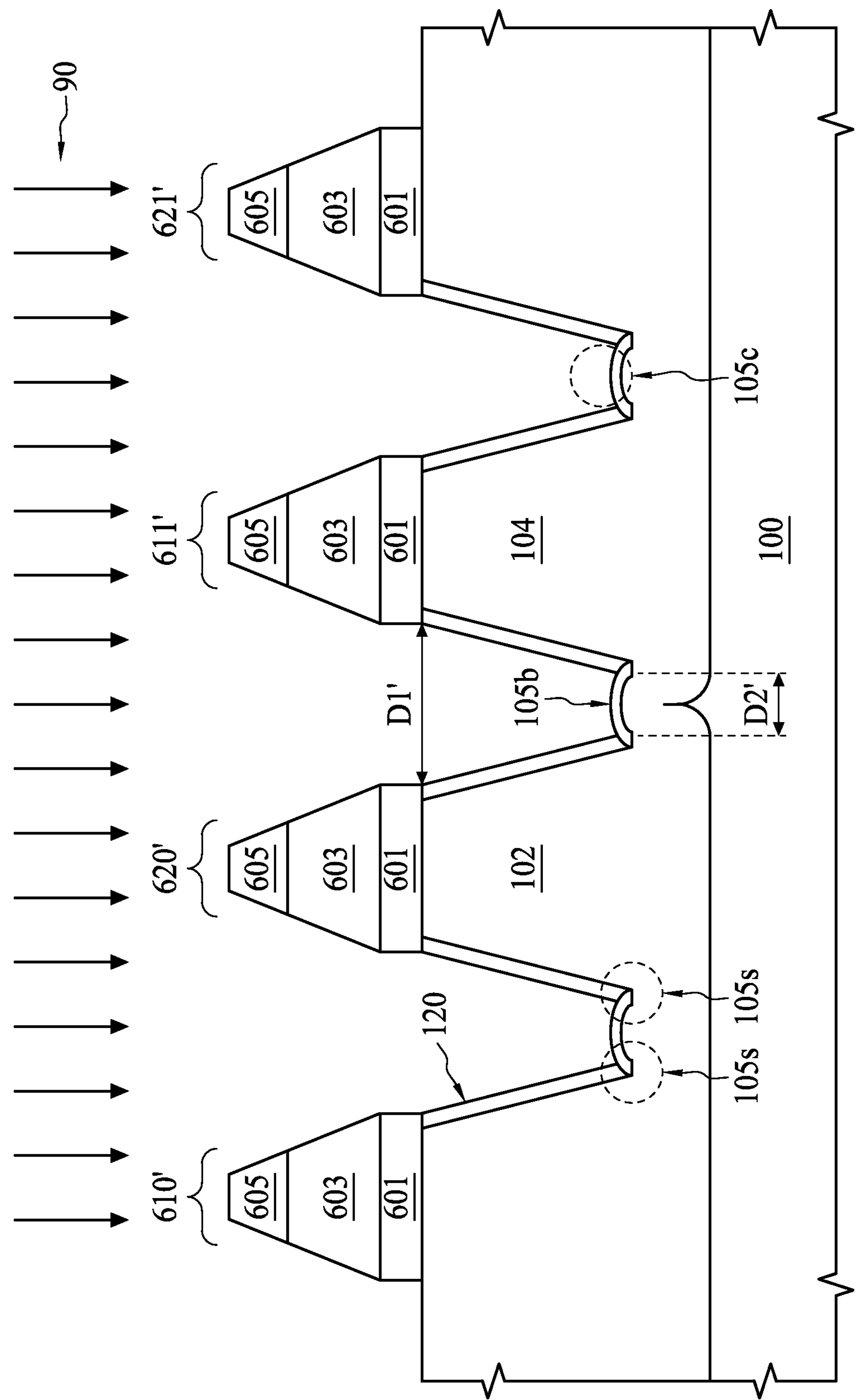
Figure 10:
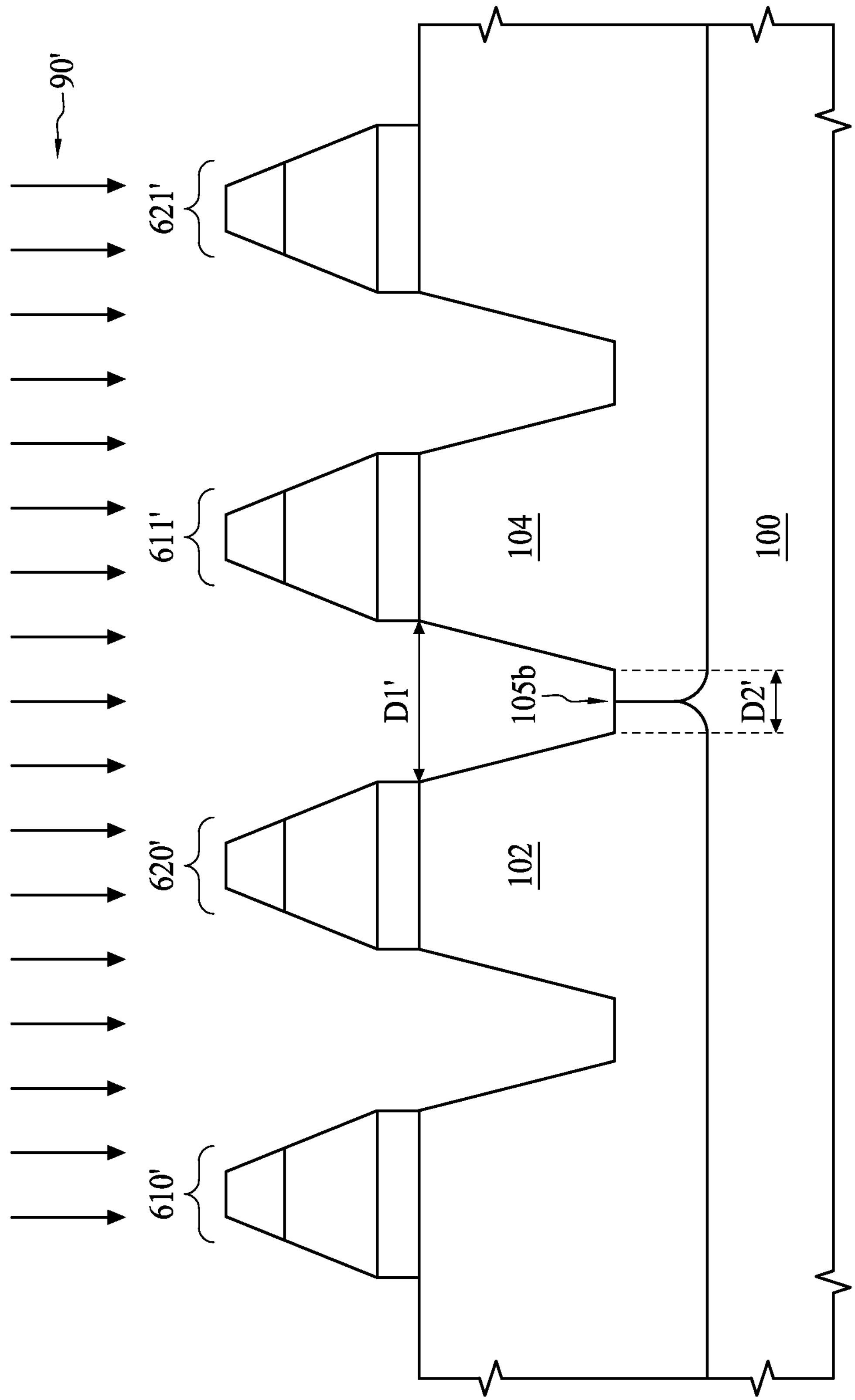
Figure 11:
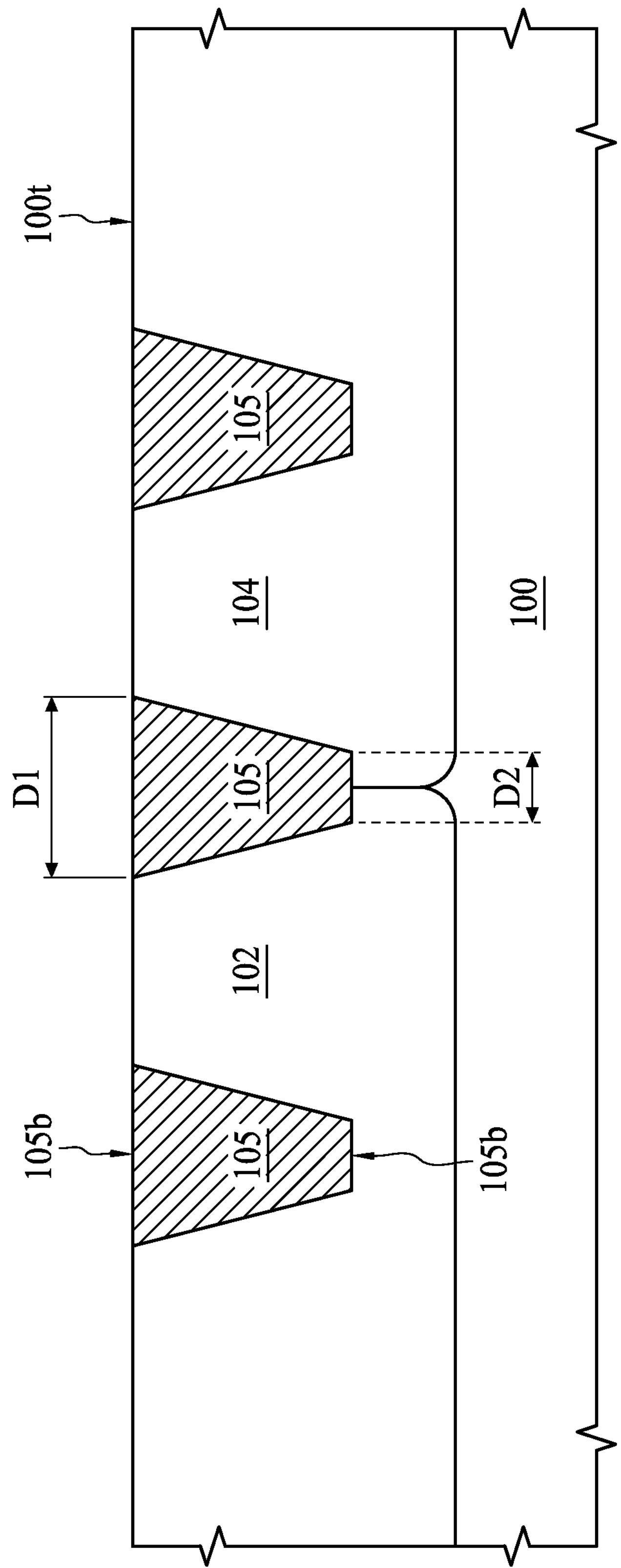

Operation 5502 can be referred to FIGS. 9 and 10 of the present disclosure. In FIG. 9, a second plasma etch is conducted to form trenches in the substrate 100. In some embodiments, zones A and B are subject to a uniform second temperature imposed by the underneath ESC 110 shown in FIG. 4B. For example, the electrical current passing through different temperature zones of the ESC 110 is controlled in a specific amount to counter the fluid flowing through or around the ESC 110 in order to maintain a uniform and desired temperature across the ESC 110. In some embodiments, the uniform second temperature is maintained in a range of from about 50 to about 80 degrees Celsius. In some embodiments, the second plasma etch operation is an in-situ, anisotropic plasma etch conducted in a same plasma etch chamber. This second plasma etch is a time-controlled process, and it continues until trenches with predetermined depth are created in semiconductor substrate 100. The chamber pressure can be controlled within a range of from about 50 to about 100 mTorr with hydrogen halide etching gas 90 such as a mixture of HBr, $O_2$, and $N_2$. During the plasma etch operation, the substrate is DC biased between about 300 volts and about 1000 volts, while an RF discharge having a power between about 500 Watts and about 1000 Watts is released into the etch chamber. In alternative embodiments, an anisotropic reactive ion etch (RIE) may be used to remove the substrate 100. Other suitable dry etch processes are not excluded from the scope of the present disclosure.

Referring to FIG. 9, $O_2/N_2$ is used to react with etch byproducts $SiBr_x$ or $SiO_xN_y$ to form and deposit $SiBr_xO_y$ 120 on the trench sidewall. This deposit protects the sidewall and restricts the etch to the vertical direction, since $SiBr_xO_y$ 120 deposited on the trench bottom 105*b* is constantly removed by ion bombardment. The first hard mask patterns 610', 620', 611', and 621' are etched at a relatively slow rate compared to the substrate 100, and in some embodiments, the taper-shaped first hard mask patterns 610', 620', 611', and 621' result to form an uneven trench bottom 105*b* due to the spatial hindrance of the ion bombardment. For example, the trench bottom 105*b* includes a subtrench 105*s* close to the corner of the trench bottom 105*b* and a convex portion 105*c* close to a center portion of the trench bottom 105*b*. As shown in FIG. 9, a line width D1' between two adjacent first hard mask patterns is narrower than 50 nm, while a width at trench bottom 105*b* is more than 20 nm. In some embodiments, the uneven trench bottom 105*b* is subsequently subject to a rounding operation as shown in FIG. 10 to level the trench bottom 105*b*.

Referring to FIG. 10, the rounding of the isolation trench bottom 105*b* is conducted through a third plasma etch at the uniform second temperature. In some embodiments the temperature of the ESC 110 shown in FIG. 4B is maintained at the second temperature during the trench formation and the rounding operation. The third plasma etch is an in-situ, anisotropic plasma etch conducted in a same plasma etch chamber. The chamber pressure can be controlled within a range of from about 1 to about 10 mTorr with hydrogen halide etching gas 90' such as a mixture of HBr, $O_2$, and $N_2$. During the third plasma etch operation, the substrate is DC biased between about 300 volts and about 1000 volts, while an RF discharge having a high power between about 1000 Watts and about 1500 Watts is released into the etch chamber. In alternative embodiments, an anisotropic reactive ion etch (RIE) may be used to remove the uneven trench bottom 105*b*. Other suitable dry etch processes are not excluded from the scope of the present disclosure.

Following FIG. 10, the first hard mask pattern features 610', 620', 611', and 621' are removed by appropriate operations. A dielectric filling operation is subsequently performed to fill and overfill the isolation trench in FIG. 11. In some embodiments, silicon oxide is filled by a chemical vapor deposition CVD process. In some embodiments, a low pressure CVD (LPCVD) silicon oxide deposition, a high density plasma (HDP) silicon oxide deposition, a TEOS silicon oxide deposition, or an atmospheric pressure CVD (APCVD) silicon oxide deposition may also be used to fill the isolation trench. A planarization operation such as a chemical mechanical polishing (CMP) operation is performed to form a level surface which a top surface 105*t* of the isolation region 105 is substantially coplanar with the substrate surface 100*t*. The dimension of the isolation region 105 is detailed in the description referring to the semiconductor structure of FIG. 1 and FIG. 2.

Some embodiments of the present disclosure provide a semiconductor structure with a reduced line feature. The semiconductor structure includes a substrate, a first active region in the substrate and having a first sidewall, a second active region in the substrate, adjacent to the first active region, and having a second sidewall, an isolation region between the first active region and the second active region, contacting the first sidewall and the second sidewall. The above-mentioned semiconductor structure possesses a width of a top surface of the isolation region and a width of a bottom surface of the isolation region. The width of a top surface of the isolation region is less than 50 nm, and the width of a bottom surface of the isolation region is more than 20 nm.

In some embodiments of the present disclosure, the isolation region is shallow trench isolation (STI).

In some embodiments of the present disclosure, an aspect ratio of the isolation region is in a range of from about 4 to about 10.

In some embodiments of the present disclosure, the first sidewall of the first active region includes a sidewall angle greater than 88 degrees.

Some embodiments of the present disclosure provide a manufacturing method for a semiconductor isolation structure with reduced line features. The method includes patterning a hard mask exposing a line feature with a line width narrower than 50 nm on a substrate by performing a first plasma etch at a first temperature, forming a trench in the substrate correlated to the line feature by performing a second plasma etch at a second temperature, rounding the bottom of the trench by performing a third plasma etch at the second temperature, and filling the trench with isolation materials.

In some embodiments of the present disclosure, the patterning a hard mask includes controlling the amount of current passing through an electrostatic chuck (ESC) supporting the substrate to maintain the first temperature.

In some embodiments of the present disclosure, the first temperature is controlled to be within a range of from about 404 to about 60 degrees Celsius.

In some embodiments of the present disclosure, the forming a trench in the substrate and rounding the bottom of the trench includes controlling the amount of current passing through an ESC supporting the substrate to maintain the second temperature.

In some embodiments of the present disclosure, the second temperature is controlled to be within a range of from about 50 to about 80 degrees Celsius In some embodiments of the present disclosure, the patterning a hard mask exposing a line feature includes introducing fluorine-containing gas, oxygen gas, and nitrogen gas into an etching chamber.

Some embodiments of the present disclosure provide a method for controlling a semiconductor line feature in a wafer. The method includes patterning a hard mask exposing a line feature with a line width narrower than 50 nm on a wafer by performing a first plasma etch, forming a trench on the wafer correlated to the line feature by performing a second plasma etch over the wafer, and filling the trench with isolation materials. The first plasma etch includes forming at least two different temperature zones across the wafer and forming at least two different plasma density zones over the wafer.

In some embodiments of the present disclosure, the forming at least two different temperature zones across the wafer includes forming concentric-distributed temperature zones with a higher temperature zone close to an edge of the wafer and a lower temperature zone close to a center of the wafer.

In some embodiments of the present disclosure, the forming concentric-distributed temperature zones include passing different amount of current through different temperature zones.

In some embodiments of the present disclosure, the forming at least two different plasma density zones over the wafer includes forming concentric-distributed plasma density zones with a higher plasma density close to an edge of the wafer and a lower plasma density close to a center of the wafer.

In some embodiments of the present disclosure, the forming at least two different plasma density zones over the wafer includes applying a current ratio between the current entering the magnetic coils close to the center of the wafer and the current entering the magnetic coils close to the edge of the wafer to be lower than 0.8.

In some embodiments of the present disclosure, the method for controlling a semiconductor line feature in a wafer further includes performing a rounding operation at the bottom of the trench under a uniform temperature across different temperature zones In some embodiments of the present disclosure, the uniform temperature is in a range of from about 50 to about 80 degrees Celsius.

In some embodiments of the present disclosure, the higher temperature zone close to the edge of the wafer is three degrees greater than the lower temperature zone close to the center of the wafer.

In some embodiments of the present disclosure, the performing the first plasma etch over the wafer includes introducing fluorine-containing gas, oxygen gas, and nitrogen gas into an etching chamber.

In some embodiments of the present disclosure, the performing the second plasma etch over the wafer includes introducing hydrogen halide gas, oxygen gas, and nitrogen gas into an etching chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method for a semiconductor isolation structure, comprising:

patterning a hard mask exposing a line feature with a line width narrower than 50 nm on a substrate by performing a first plasma etch at a first temperature;

forming a trench having a sidewall angle greater than 88 degrees in the substrate correlated to the line feature by performing a second plasma etch at a second temperature;

rounding a bottom of the trench by performing a third plasma etch at the second temperature; and filling the trench with isolation materials, wherein the first plasma etch is performed with at least two different plasma densities along a radial direction of the hard mask simultaneously, and the second plasma etch is performed with a uniform plasma density along the radial direction of the hard mask, and wherein the at least two different plasma densities are formed by applying a current ratio in a range of from about 0.5 to about 0.8 between the current entering a first set of magnetic coils close to a center of the wafer and the current entering a second set of the magnetic coils close to an edge of the wafer.

2. The manufacturing method of claim 1, wherein the patterning a hard mask comprises controlling the amount of current passing through an electrostatic chuck supporting the substrate to maintain the first temperature.

3. The manufacturing method of claim 2, wherein the first temperature is controlled to be within a range of from about 40 to about 60 degrees Celsius.

4. The manufacturing method of claim 1, wherein the forming a trench in the substrate and rounding the bottom of the trench comprises controlling the amount of current passing through an electrostatic chuck supporting the substrate to maintain the second temperature.

5. The manufacturing method of claim 4, wherein the second temperature is controlled to be within a range of from about 50 to about 80 degrees Celsius.

6. The manufacturing method of claim 1, wherein the patterning a hard mask exposing a line feature comprises introducing fluorine-containing gas, oxygen gas, and nitrogen gas into an etching chamber.

7. A method for controlling a semiconductor line feature in a wafer, comprising:

patterning a hard mask exposing a line feature with a line width narrower than 50 nm on a wafer by performing a first plasma etch, comprising:

forming at least two different temperature zones across the wafer, comprising forming concentric-distributed temperature zones with a higher temperature zone close to an edge of the wafer and a lower temperature zone close to a center of the wafer, and the higher temperature zone being three degrees Celsius greater than the lower temperature zone; and forming at least two different plasma density zones over the wafer by applying a current ratio lower than 0.8 between the current entering a first set of magnetic coils close to the center of the wafer and the current entering a second set of the magnetic coils close to the edge of the wafer;

forming a trench having a sidewall angel greater than 88 degrees in the wafer correlated to the line feature by performing a second plasma etch over the wafer; and filling the trench with isolation materials.

8. The method for controlling a semiconductor line feature in a wafer of claim 7, wherein the forming concentric-distributed temperature zones comprises passing different amount of current through different temperature zones.

9. The method for controlling a semiconductor line feature in a wafer of claim 7, wherein the forming at least two different plasma density zones over the wafer comprises forming concentric-distributed plasma density zones with a higher plasma density close to the edge of the wafer and a lower plasma density close to the center of the wafer.

10. The method for controlling a semiconductor line feature in a wafer of claim 9, wherein the forming at least two different plasma density zones over the wafer comprises applying a current ratio between the current entering the magnetic coils close to the center of the wafer and the current entering the magnetic coils close to the edge of the wafer to be in a range of from about 0.5 to about 0.8.

11. The method for controlling a semiconductor line feature in a wafer of claim 7, further comprising performing a rounding operation at the bottom of the trench under a uniform temperature across different temperature zones.

12. The method for controlling a semiconductor line feature in a wafer of claim 11, wherein the uniform temperature is in a range of from about 50 to about 80 degrees Celsius.

13. The method for controlling a semiconductor line feature in a wafer of claim 7, wherein the performing the first plasma etch over the wafer comprises introducing fluorine-containing gas, oxygen gas, and nitrogen gas into an etching chamber.

14. The method for controlling a semiconductor line feature in a wafer of claim 7, wherein the performing the second plasma etch over the wafer comprises introducing hydrogen halide gas, oxygen gas, and nitrogen gas into an etching chamber.

15. A manufacturing method for a semiconductor isolation structure, comprising:

patterning a hard mask exposing a line feature with a line width narrower than 50 nm on a wafer by performing a first plasma etch, comprising:

forming at least two different temperature zones across the wafer, comprising forming concentric-distributed temperature zones with a higher temperature zone close to an edge of the wafer and a lower temperature zone close to a center of the wafer, and the higher temperature zone being three degrees Celsius greater than the lower temperature zone; and forming at least two different plasma density zones over the wafer by applying a current ratio lower than 0.8 between the current entering a first set of magnetic coils close to the center of the wafer and the current entering a second set of the magnetic coils close to the edge of the wafer;

forming a trench having a sidewall angle greater than 88 degrees in the wafer correlated to the line feature by performing a second plasma etch over the wafer; and rounding a bottom of the trench by performing a third plasma etch.

16. The manufacturing method of claim 15, wherein the forming at least two different plasma density zones over the wafer comprises controlling a current ratio in a range of from about 0.5 to about 0.8, wherein the first set and second set of the magnetic coils are electromagnetic coils.

17. The manufacturing method of claim 15, wherein the forming at least two different temperature zones across the wafer comprises flowing a fluid into an electrostatic chuck (ESC) supporting the wafer, passing desired amount of current into or around the ESC, or a combination thereof.

18. The manufacturing method of claim 15, wherein the second plasma etch is a time-controlled process.

* * * * *